(12) United States Patent
Huang et al.

(10) Patent No.: US 11,108,022 B2
(45) Date of Patent: Aug. 31, 2021

(54) OLED DEVICE, METHOD FOR MANUFACTURING THE SAME, AND DISPLAY APPARATUS

(71) Applicant: BOE Technology Group Co., Ltd., Beijing (CN)

(72) Inventors: Qingyu Huang, Beijing (CN); Zhiqiang Jiao, Beijing (CN); Huajie Yan, Beijing (CN); Xiaoyun Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 46 days.

(21) Appl. No.: 16/491,300

(22) PCT Filed: Mar. 22, 2019

(86) PCT No.: PCT/CN2019/079301
§ 371 (c)(1),
(2) Date: Sep. 5, 2019

(87) PCT Pub. No.: WO2019/196629
PCT Pub. Date: Oct. 17, 2019

(65) Prior Publication Data
US 2020/0295306 A1 Sep. 17, 2020

(30) Foreign Application Priority Data
Apr. 13, 2018 (CN) .......................... 201810333526.X

(51) Int. Cl.
*H01L 51/52* (2006.01)
*H01L 51/56* (2006.01)

(52) U.S. Cl.
CPC ...... *H01L 51/5268* (2013.01); *H01L 51/5278* (2013.01); *H01L 51/56* (2013.01); *H01L 2251/5315* (2013.01)

(58) Field of Classification Search
CPC ............. H01L 51/5268; H01L 51/5278; H01L 2251/5315; H01L 51/56
See application file for complete search history.

(56) References Cited

U.S. PATENT DOCUMENTS 8,283,845 B2  10/2012 Itou et al.
8,492,972 B2   7/2013 Hirakata
(Continued)

FOREIGN PATENT DOCUMENTS

CN  101030627 A   9/2007
CN  101598909 A  12/2009
(Continued)

OTHER PUBLICATIONS

First Office Action, including Search Report, for Chinese Patent Application No. 201810333526.X, dated Apr. 1, 2019, 12 pages.
(Continued)

*Primary Examiner* — Anthony Ho
(74) *Attorney, Agent, or Firm* — Westman, Champlin & Koehler, P.A.

(57) ABSTRACT

An OLED device, a method for manufacturing the same, and a display apparatus are provided. The OLED device includes: an anode; a cathode; at least two organic light emitting layers between the anode and the cathode; a charge generation layer between two adjacent organic light emitting layers. At least one of two surfaces of the charge generation layer adjacent to the two adjacent organic light emitting layers is provided with microstructures.

18 Claims, 5 Drawing Sheets

(56) References Cited

U.S. PATENT DOCUMENTS

| | | |
|---|---|---|
| 8,968,044 B2 | 3/2015 | Hirakata |
| 9,065,075 B1 | 6/2015 | Jeon et al. |
| 9,219,252 B2 | 12/2015 | Nishimura et al. |
| 2008/0018231 A1 | 1/2008 | Hirakata |
| 2010/0060142 A1 | 3/2010 | Itou et al. |
| 2013/0309933 A1 | 11/2013 | Hirakata |
| 2015/0060840 A1 | 3/2015 | Nishimura et al. |
| 2015/0171371 A1 | 6/2015 | Jeon et al. |
| 2017/0338447 A1 | 11/2017 | Xu |

FOREIGN PATENT DOCUMENTS

| | | |
|---|---|---|
| CN | 101647316 A | 2/2010 |
| CN | 103972403 A | 8/2014 |
| CN | 104380843 A | 2/2015 |
| CN | 104716159 A | 6/2015 |
| CN | 104966789 A | 10/2015 |
| CN | 106654051 A | 5/2017 |
| CN | 108470847 A | 8/2018 |

OTHER PUBLICATIONS

Second Office Action, including Search Report, for Chinese Patent Application No. 201810333526.X, dated May 28, 2019, 10 pages.
Rejection Decision, for Chinese Patent Application No. 201810333526.X, dated Aug. 13, 2019, 7 pages.

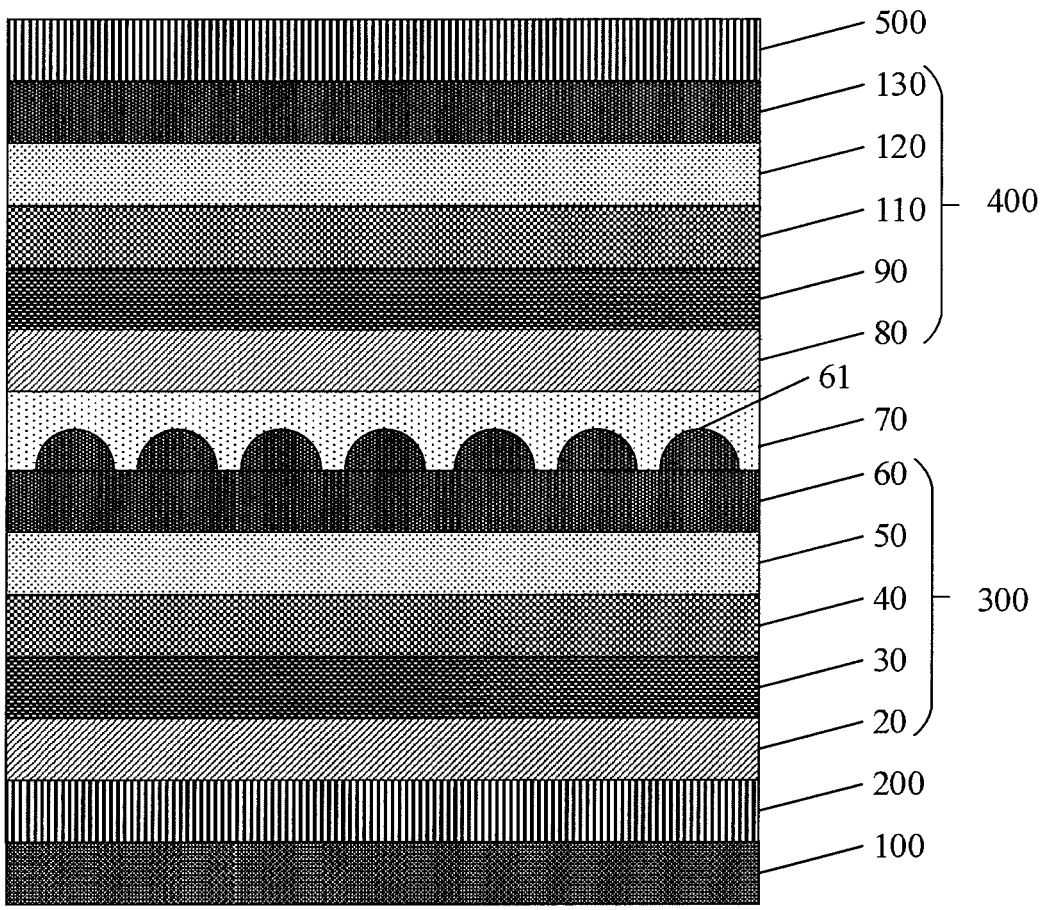

FIG. 3

| sequentially forming an anode, a first hole injection layer, a first hole transport layer, a first light emitting layer, a first electron transport layer, and a first electron injection layer that are laminated on the base substrate | — S31 |

| forming protruded microstructures on a surface of the first electron injection layer away from the base substrate | — S32 |

| forming a charge generation layer on the first electron injection layer, the charge generation layer covering the protruded microstructures, and a surface of the charge generation layer adjacent to the first electron injection layer being formed correspondingly with the recessed first microstructures | — S33 |

FIG. 4

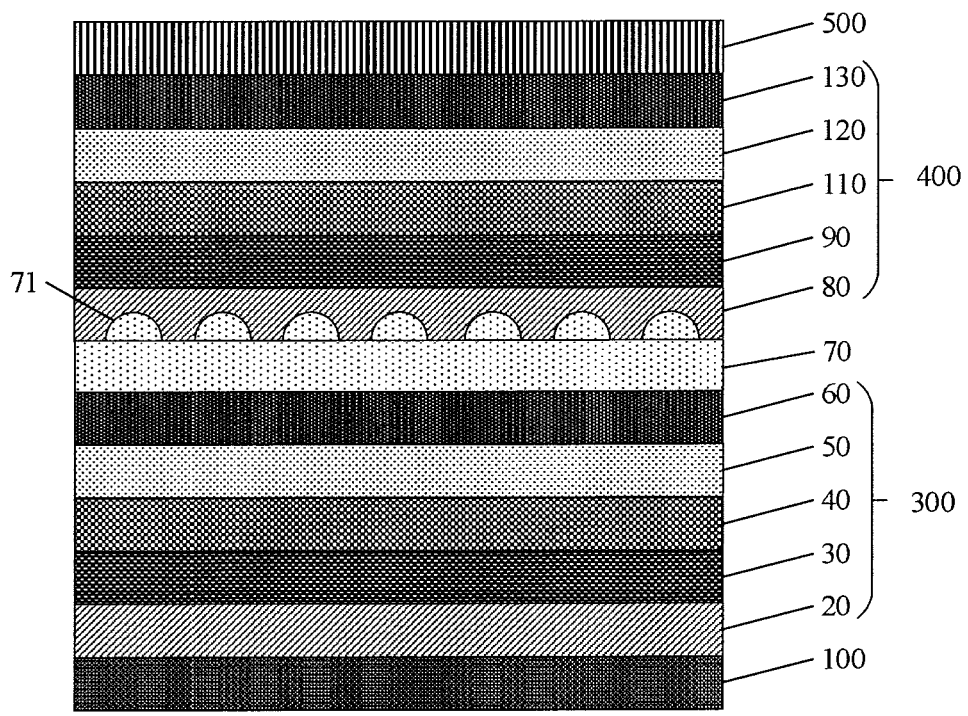

FIG. 7

| sequentially forming an anode, a first hole injection layer, a first hole transport layer, a first light emitting layer, a first electron transport layer, a first electron injection layer, and a charge generation layer that are laminated on the base substrate | — S71 |

| forming protruded second microstructures on a surface of the charge generation layer away from the first electron injection layer | — S72 |

FIG. 8

OLED DEVICE, METHOD FOR MANUFACTURING THE SAME, AND DISPLAY APPARATUS

CROSS-REFERENCE TO RELATED APPLICATION

This application is a Section 371 National Stage Application of International Application No. PCT/CN2019/079301, filed on Mar. 22, 2019, entitled "OLED DEVICE, METHOD FOR MANUFACTURING THE SAME, AND DISPLAY APPARATUS", which claims priority to Chinese Patent Application No. 201810333526.X filed on Apr. 13, 2018 with CNIPA, incorporated herein by reference in entirety.

TECHNICAL FIELD

Embodiments of the present disclosure relate to the field of display technology, and in particular, to an OLED device, a method for manufacturing the same, and a display apparatus.

BACKGROUND

OLEDs (Organic Light Emitting Diodes) have various advantages, such as autonomous luminescence, wide viewing angle, light weight, wide applicable temperature range, large area, complete solidification, flexibility, low power consumption, fast response, low manufacturing cost, and the like, and have important applications in the field of display and illumination, and therefore they have attracted wide attention from academia and industry.

However, for OLEDs in series, it is necessary to consider problems of voltage increase of the device and power consumption increase of the device.

SUMMARY

In embodiments of the present disclosure, there are provided the following technical solutions:

An OLED device, comprising:
an anode;
a cathode;
at least two organic light emitting layers between the anode and the cathode;
a charge generation layer between two adjacent organic light emitting layers,
wherein at least one of two surfaces of the charge generation layer adjacent to the two adjacent organic light emitting layers is provided with microstructures.

In some embodiments of the present disclosure, a surface of the charge generation layer away from the anode is provided with the microstructures, and the microstructures protrude toward a direction away from the anode.

In some embodiments of the present disclosure, a surface of the charge generation layer adjacent to the anode is provided with the microstructures, and the microstructures are recessed toward a direction away from the anode.

In some embodiments of the present disclosure, the microstructures are in a shape of a hemisphere, a semi-ellipsoid, a hexahedron, a cylinder, a cone, a prism, a pyramid, a truncated cone or a truncated prism.

In some embodiments of the present disclosure, the microstructures are plural and the plurality of microstructures are arranged in an array.

In some embodiments of the present disclosure, the at least two organic light emitting layers comprise a first organic light emitting layer and a second organic light emitting layer, the first organic light emitting layer being disposed between the anode and the charge generation layer, and the second organic light emitting layer being disposed between the charge generation layer and the cathode, and
wherein the first organic light emitting layer comprises: a first hole injection layer, a first hole transport layer, a first light emitting layer, a first electron transport layer, and a first electron injection layer which are sequentially laminated on the anode, and the second organic light emitting layer comprises a second hole injection layer, a second hole transport layer, a second light emitting layer, a second electron transport layer, and a second electron injection layer which are sequentially laminated on the charge generation layer.

In some embodiments of the present disclosure, the OLED device is a top emission type light emitting device.

In some embodiments of the present disclosure, the OLED device further comprises a base substrate disposed on a surface of the anode away from the charge generation layer.

In some embodiments of the present disclosure, the base substrate is a glass substrate or a flexible substrate.

In some embodiments of the present disclosure, the microstructures comprise protruding structures extending away from the anode, and the microstructures have a profile in a shape of semicircle or arc in a cross section perpendicular to the organic light emitting layers.

In some embodiments of the present disclosure, the microstructures comprise recessed structures extending away from the anode, and the microstructures have a profile in a shape of semicircle or arc in a cross section perpendicular to the organic light emitting layers In some embodiments of the present disclosure, the microstructures are uniformly distributed.

In some embodiments of the present disclosure, a surface of the charge generation layer is provided with protrusions and a surface of one of the organic light emitting layers adjacent to the charge generation layer is provided with recesses; or a surface of the charge generation layer is provided with recesses and a surface of one of the organic light emitting layers adjacent to the charge generation layer is provided with protrusions.

According to another aspect of the present disclosure, there is also provided a method for manufacturing the OLED device according to any one of the above embodiments, comprising:
forming a structure in which one of the at least two organic light emitting layers, the charge generation layer, and another of the at least two organic light emitting layers are sequentially laminated,
wherein the forming a structure in which one of the at least two organic light emitting layers, the charge generation layer, and another of the at least two organic light emitting layers are sequentially laminated comprises forming the microstructures on the at least one of two surfaces of the charge generation layer adjacent to the two adjacent organic light emitting layers.

In some embodiments of the present disclosure, the forming the microstructures on the at least one of two surfaces of the charge generation layer adjacent to the two adjacent organic light emitting layers comprises:

forming the microstructures on a surface of the charge generation layer away from the anode, the microstructures protruding toward a direction away from the anode.

In some embodiments of the present disclosure, the forming the microstructures on the at least one of two surfaces of the charge generation layer adjacent to the two adjacent organic light emitting layers comprises:

forming the microstructures on a surface of the charge generation layer adjacent to the anode, the microstructures being recessed toward a direction away from the anode.

In some embodiments of the present disclosure, the method further comprises: forming the anode; and forming the cathode, wherein the forming a structure in which one of the at least two organic light emitting layers, the charge generation layer, and another of the at least two organic light emitting layers are sequentially laminated comprises:

sequentially forming a first hole injection layer, a first hole transport layer, a first light emitting layer, a first electron transport layer, and a first electron injection layer that are laminated on the anode;

forming the charge generation layer on the first electron injection layer;

sequentially forming a second hole injection layer, a second hole transport layer, a second light emitting layer, a second electron transport layer, and a second electron injection layer that are laminated on the charge generation layer.

In some embodiments of the present disclosure, before the forming the anode, the method further comprises forming a base substrate, wherein the anode is disposed on the base substrate.

In some embodiments of the present disclosure, the base substrate is a glass substrate or a flexible substrate.

In some embodiments of the present disclosure, before the forming the microstructures on a surface of the charge generation layer adjacent to the anode, the method comprises: forming protruded microstructures on a surface of the organic light emitting layer between the anode and the charge generation layer away from the anode.

In some embodiments of the present disclosure, the microstructures are formed by using an evaporation, sputtering or plasma deposition process.

According to still another aspect of the present disclosure, there is further provided a display apparatus, comprising the OLED device according to any one of the above embodiments.

Additional aspects and advantages of the embodiments of the present disclosure will be partially set forth in the following description, and they will be apparent from the following description or will be learnt from the implementation of the embodiments of the present disclosure.

BRIEF DESCRIPTION OF THE DRAWINGS

The above and/or additional aspects and advantages of the embodiments of the present disclosure will become apparent and easily understood from the description of the embodiments of the present disclosure with reference to the accompanying drawings. In the drawings:

FIG. 3 is a schematic structural view of an OLED device according to an embodiment of the present disclosure;

FIG. 4 is a schematic flow chart of a method for manufacturing the OLED device provided by the embodiment shown in FIG. 3;

FIG. 7 is a schematic structural view of an OLED device according to an embodiment of the present disclosure;

FIG. 8 is a schematic flow chart of a method for manufacturing the OLED device provided by the embodiment shown in FIG. 7.

DETAILED DESCRIPTION OF EMBODIMENTS

Figure 1:
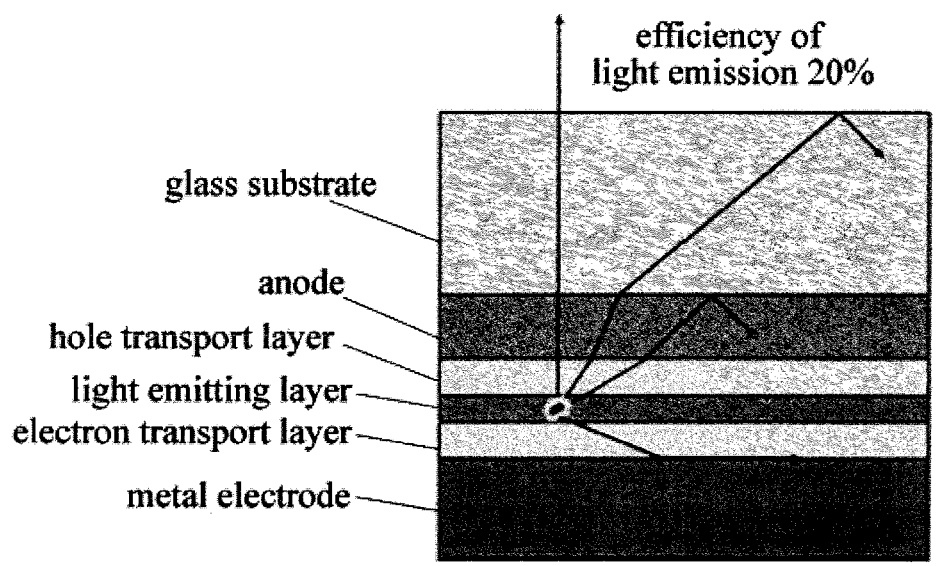
FIG. 1 shows light emission of a bottom emission type OLED device.

The embodiments of the present disclosure will be described in detail below. Examples of the embodiments are illustrated in the drawings, wherein the same or similar reference numerals indicate the same or similar elements or elements having the same or similar functions throughout the specification and the claims. The embodiments described below with reference to the accompanying drawings are exemplary, and they are intended to explain the present disclosure but not to be construed as limiting the present disclosure.

In order to realize a high PPI (Pixels Per Inch) display, in the related art, a plurality of independent light emitting units are stacked, so that a current of the same magnitude successively flows through a plurality of different light emitting units to allow them to collectively emit light, thereby improving the brightness and efficiency of light emission and forming OLEDs in series. Generally, a plurality of light emitting unit devices are connected in series by using a charge generation layer (CGL) as a connection layer. Compared with a single light emitting unit device, the current efficiency and the brightness of light emission of the devices in series can be multiplied. However, such devices adopt a metal film as a cathode, and the strong reflection characteristic of its metal inevitably produces a strong microcavity effect, which affects the efficiency of light emission and the color rendering of the devices. The light emission of a bottom emission type OLED device is as shown in FIG. 1. The bottom emission type OLED device comprises a metal electrode, an electron transport layer, a light emitting layer, a hole transport layer, an anode and a glass substrate which are sequentially laminated, and the light emitted from the light emitting layer undergoes refraction, reflection and absorption by various layers, and the efficiency of light emission is about 20%. Moreover, for the OLED of series structure, since it has a plurality of light emitting units, it is necessary to provide a charge generation layer, as an internal electrode of the device, in the device, which however would cause an increase in voltage of the device and an increase in power consumption of the device, and therefore limit the application of OLED display technology in the field of microdisplay.

An object of the embodiments of the present disclosure is to provide an OLED device, a method for manufacturing the same, and a display apparatus, which increase a contact area between a charge generation layer and an adjacent functional layer, improve the capability of the charge generation layer to generate and transfer charge, and reduce the operating voltage of the OLED device.

In an embodiment of the present disclosure, it first provides an OLED device, including: an anode 200, a cathode 500, and at least two organic light emitting layers disposed between the anode 200 and the cathode 500. A charge generation layer 70 is provided between two adjacent organic light emitting layers, at least one of two surfaces of the charge generation layer 70 adjacent to the two organic light emitting layers is provided with microstructures.

Specifically, the definition that at least one of two surfaces of the charge generation layer adjacent to the two organic light emitting layers is provided with microstructures includes: a surface of the charge generation layer adjacent to the anode is provided with the microstructures, and/or a surface of the charge generation layer away from the anode is provided with the microstructures.

Figure 2:
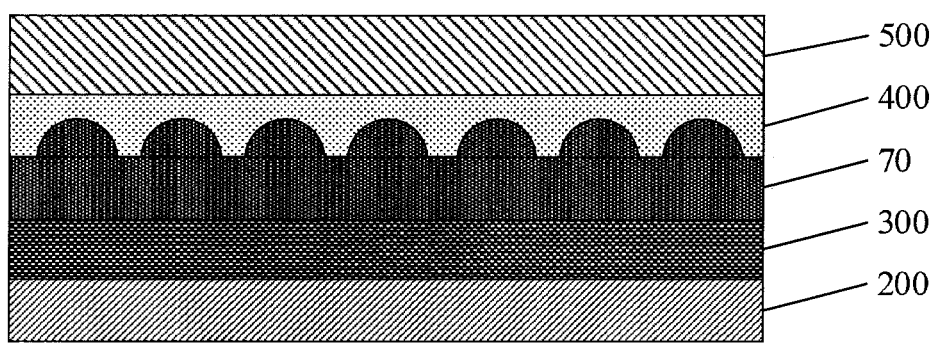
FIG. 2 is a schematic view showing an overall structure of an OLED device according to an embodiment of the present disclosure.

In one example, a schematic structural view of an OLED device is shown in FIG. 2, the OLED device includes two organic light emitting layers, one of the two organic light emitting layers disposed between the anode 200 and the charge generation layer 70 is referred to as a first organic light emitting layer 300, and the other one of the two organic light emitting layers disposed between the charge generation layer 70 and the cathode 500 is referred to as a second organic light emitting layer 400.

In one example, the organic light emitting layers each include a hole transport layer, a light emitting layer, and an electron transport layer which are sequentially laminated.

The microstructures refer to a phenomenon of non-uniform structure in a crystal structure that can be observed only by means of an optical microscope or an electron microscope. The microstructures may be protruded structures or recessed structures. If the microstructures refer to protruded structures, the shape of the microstructures includes, but is not limited to, a hemisphere, a semi-ellipsoid, a hexahedron, a cylinder, a cone, a prism, a pyramid, a truncated cone or a truncated prism.

The microstructures are uniformly-distributed microstructures, and the microstructures are protruded structures that protrude from a flat surface of the charge generation layer, or recessed structures that are recessed from a flat surface of the charge generation layer, rather than structures in which protrusions and recesses are included. In the OLED device, it does not include any scattering layer.

In the case where the microstructures provided on the surface of the charge generation layer away from the anode are protruded microstructures, or the microstructures provided on the surface of the charge generation layer adjacent to the anode are recessed microstructures, the OLED device is a top emission type light emitting device. In some embodiments of the present disclosure, in one example, the OLED device is a top emission type light emitting device.

In one example, the microstructures are a plurality of microstructures of the same size arranged in an array, for example, a bottom area of each of the microstructures is 30*30 um$^2$, and an interval between two adjacent microstructures is 20 um.

In one example, the surface of the anode 200 away from the charge generation layer 70 is further provided with a base substrate 100, which may be a glass substrate, a flexible substrate, or the like.

The charge generation layer serves as a functional layer of the plurality of light emitting units in series, and the charge generation layer is used to connect two organic light emitting layers to form a multi-light emitting unit device, to increase the voltage of the device. In the embodiments of the present disclosure, the contact area between the charge generation layer and its adjacent layer is increased by providing microstructures on at least one surface of the charge generation layer 70, thereby increasing the effective area of the charge generation layer to generate and inject charge, improving capability of the charge generation layer to generate and transport charge, and reducing the operating voltage of the OLED device.

Further, in an embodiment of the present disclosure, it further provides a method for manufacturing the OLED according to any one of the foregoing technical solutions. The method includes the following steps:

forming a charge generation layer between the two organic light emitting layers, at least one of two surfaces of the charge generation layer adjacent to the two adjacent organic light emitting layers being provided with microstructures. Specifically, the method comprises: forming microstructures on at least one surface of the charge generation layer by evaporation. The formation of microstructures by an evaporation process makes composition and thickness of the microstructures easily be controlled, thereby improving the manufacturing precision of the microstructures.

The method for manufacturing the OLED device further includes: forming an organic light emitting layer on the anode; forming a charge generation layer on the organic light emitting layer; and forming another organic light emitting layer on the charge generation layer.

Specifically, different embodiments are provided as follows to set forth the implementations of the embodiments of the present disclosure:

In the embodiment of FIG. 3, the organic light emitting layers each include a hole injection layer, a hole transport layer, a light emitting layer, an electron transport layer, and an electron injection layer. The OLED device includes two organic light emitting layers, a first organic light emitting layer 300 thereof includes a first hole injection layer 20, a first hole transport layer 30, a first light emitting layer 40, a first electron transport layer 50, and a first electron injection layer 60 which are sequentially laminated on the anode 200, and a second organic light emitting layer 400 thereof includes a second hole injection layer 80, a second hole transport layer 90, a second light emitting layer 110, a second electron transport layer 120, and a second electron injection layer 130 which are sequentially laminated on the charge generation layer.

The schematic structural view of the OLED device provided by this embodiment is as shown in FIG. 3. The OLED device includes an anode 200, a first hole injection layer 20, a first hole transport layer 30, a first light emitting layer 40, a first electron transport layer 50, a first electron injection layer 60, a charge generation layer 70, a second hole injection layer 80, a second hole transport layer 90, a second light emitting layer 110, a second electron transport layer 120, a second electron injection layer 130, and a cathode 500 which are sequentially laminated on a base substrate 100. A surface of the charge generation layer 70 adjacent to the first electron injection layer 60 is provided with first microstructures 61. The first microstructures 61 are recessed toward a direction away from the base substrate 100. The surface of the charge generation layer 70 adjacent to the first electron injection layer 60 is provided with recessed first microstructures 61, accordingly, the surface of the first electron injection layer adjacent to the charge generation layer is formed with protruded microstructures.

The first microstructures 61 include a plurality of first microstructures 61 arranged in an array. The plurality of first microstructures 61 in an array scatter light emitted from the first light emitting layer 40, and the charges generated throughout the charge generation layer 70 are uniformly distributed to make the light emission uniform.

In this embodiment, the contact area between the charge generation layer and its adjacent layer is increased by providing the recessed first microstructures 61 on the surface of the charge generation layer 70 adjacent to the first electron injection layer 60, thereby increasing the effective area of the charge generation layer to generate and inject charge, improving capability of the charge generation layer to generate and transport charge, and reducing the operating voltage of the OLED device.

Correspondingly, in an embodiment of the present disclosure, there is further provided a method for manufacturing the OLED device according to any one of the above technical solutions, referring to the schematic flow chart as shown in FIG. 4, the method includes the following steps:

S31: sequentially forming an anode, a first hole injection layer, a first hole transport layer, a first light emitting layer, a first electron transport layer, and a first electron injection layer that are laminated on the base substrate;

The base substrate includes a glass substrate or a flexible substrate. The step S31 includes: forming a first hole injection layer on the base substrate; forming a first hole transport layer on the first hole injection layer; forming a first light emitting layer on the first hole transport layer; forming a first electron transport layer on the first light emitting layer; and forming a first electron injection layer on the first electron transport layer.

In the above forming process, each of the device layers is formed by an open mask. The forming process includes deposition methods such as evaporation, sputtering, or plasma deposition. In this embodiment, an evaporation process is used to form the functional layers.

In one example, the materials for manufacturing the functional layers and the thicknesses of the functional layers formed by the evaporation process are as follows:

A first hole injection layer having a thickness of 10 nm is formed on the base substrate from tetrafluoro tetracyanoquinodimethane (abbreviation: F4TCNQ) by an evaporation process, a first hole transport layer having a thickness of 25 nm is formed on the first hole injection layer from N,N'-diphenyl-N,N'-bis(3-methylphenyl)-1,1'-biphenyl-4,4'-diamine (abbreviation: TPD) material, a first light emitting layer having a thickness of 30 nm is formed on the first hole injection layer from (acetylacetone)bis(2-methyldibenzo[f,h]quinoxaline)iridium (abbreviation: NPD:Ir(MDQ)2 (acac)) material, and a first electron injection layer having a thickness of 10 nm is formed on the first electron transport layer from 1,3,5-tris[(3-pyridyl)-3-phenyl]benzene (abbreviation: TmPyPB) material.

It should be noted that the materials and the formed thicknesses of the above functional layers only represent one implementation mode, the materials for forming the above functional layers other than the above-mentioned materials are not limited, and the thickness of each functional layer is not limited to the numerical values listed in the above embodiments. The above materials and thicknesses should not be construed as limiting the embodiments of the present disclosure.

S32: forming protruded microstructures on a surface of the first electron injection layer away from the base substrate;

In this embodiment, the protruded microstructures are formed on the first electron injection layer by an evaporation process using a fine metal mask (FME), the protruded microstructures protrude toward a direction away from the base substrate. The shape of the protruded microstructures includes, but is not limited to, a hemisphere, a semi-ellipsoid, a hexahedron, a cylinder, a cone, a prism, a pyramid, a truncated cone or a truncated prism. The manufacturing process is: microstructures having a height of 5 nm are formed on the first electron injection layer from 1,3,5-tris[(3-pyridyl)-3-phenyl]benzene (abbreviation: TmPyPB) material. The protruded microstructures include a plurality of microstructures of the same size arranged in an array, for example, a bottom area of each of the microstructures is 30*30 um$^2$, and an interval between two adjacent protruded microstructures is 20 um.

S33: forming a charge generation layer on the first electron injection layer, the charge generation layer covering the protruded microstructures, and a surface of the charge generation layer adjacent to the first electron injection layer being formed correspondingly with the recessed first microstructures.

In this embodiment, the charge generation layer (CGL for short) is formed on the first electron injection layer by using an open mask. In one example, a charge generation layer having a thickness of 15 nm is formed from 4,7-diphenyl-1,10-phenanthroline (abbreviation: Bphen) material by an evaporation process. Since the protruded microstructures protrude toward a direction away from the base substrate, the surface of the charge generation layer adjacent to the base substrate necessarily forms microstructures having a recessed structure, the recessed microstructures being the first microstructures.

In this embodiment, a test in which distribution parameters of the protruded microstructures corresponding to the first microstructures refer to a group of first parameters is implemented. The group of first parameters includes: an axial section width L1 of the protruded microstructures on the first electron injection layer is 30 um, a distance L2 between two adjacent uniformly-distributed microstructures is 20 um, a height H of the microstructures is 7 nm, and a thickness of the charge generation layer is 20 nm. Herein, the axial section width refers to a dimension in one direction in a cross section perpendicular to the protruding direction of the protruded microstructures; the distance between two adjacent microstructures refers to a distance from a side of one microstructure to the same side of its adjacent microstructure, for example, a distance between the left sides of two adjacent microstructures.

Figure 5:
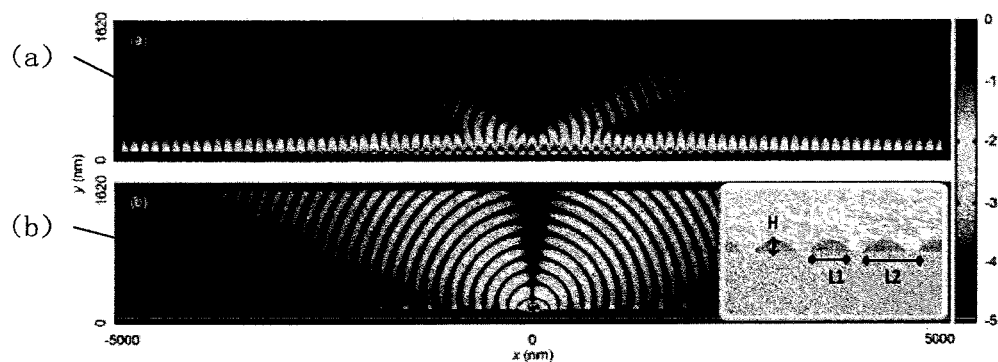
FIG. 5 shows an optical simulation in a case where distribution parameters of protruded microstructures in the OLED device provided by the embodiment shown in FIG. 3 refer to a group of first parameters.

In this embodiment, when the distribution parameters of the protruded microstructures corresponding to the first microstructures refer to the group of first parameters, an optical simulation in a case where there are no microstructures on the first electron injection layer (FIG. 5(*a*)) and an optical simulation in a case where the first microstructures are provided on the first electron injection layer (FIG. 5(*b*)) are shown in FIG. 5. FIG. 5(*a*) is located in an upper half of FIG. 5, and FIG. 5(*b*) is located in a lower half of FIG. 5, where x coordinate represents a lateral position coordinate of the OLED, y coordinate represents a longitudinal position coordinate of the OLED, the bar showing grey scale on the right side represents a relative intensity value of emergent wavelength, therefore the intensity distribution of the emergent wavelength can be observed by means of the light and dark stripes in the drawing. As shown in FIG. 5(a), when there are no microstructures on the first electron injection layer, that is, the first electron injection layer is of a flat layer, the light emitted from the first light emitting layer is reflected and refracted by the functional layers of the device, therefore the light loss rate is large, and the light emission rate is low, thereby the brightness of the OLED device is low. As shown in FIG. 5(b), the first electron injection layer is provided with first microstructures. Since the first microstructures increase the scattering of light in the OLED device and break the original total reflection path of the light, the light emission rate is increased, and the light loss rate is reduced, and accordingly the brightness of the OLED device is high. Moreover, since the first microstructures change the incident angle of the original light on the light exit surface and therefore change the wavelength of the emergent light, the color rendering of the OLED device is improved.

Figure 6:
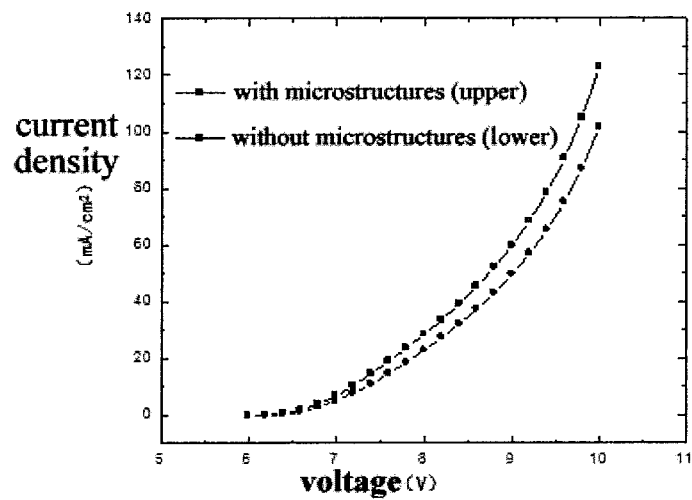
FIG. 6 shows a current density of the OLED device in a case where distribution parameters of protruded microstructures in the OLED device provided by the embodiment shown in FIG. 3 refer to a group of first parameters.

A current density of the OLED device in a case where the distribution parameters of the protruded microstructures corresponding to the first microstructures refer to the group of first parameters is as shown in FIG. 6. In the drawing, a change of current density in a case where there are no microstructures on the first electron injection layer and a change of current density in a case where the first microstructures are provided on the first electron injection layer are compared. As can be seen from the drawing, as the voltage increases, the current increases exponentially no matter whether the OLED device contains the first microstructures or not. However, it is apparent that at the same voltage value, the current of the OLED device with the first microstructures is larger than that of the OLED device without microstructures. Moreover, the current difference becomes larger as the voltage increases. Experimental data indicate that the first microstructures in the OLED device increase the capability of the charge generation layer to generate and transfer charge, thereby reducing the operating voltage of the device and increasing the operating current.

In a case where the distribution parameters of the protruded microstructures corresponding to the first microstructures refer to the group of first parameters, an electrical property in a case where there are no microstructures in the OLED device and an electrical property in a case where the first microstructures are provided are measured and compared by the designer. The comparison results are shown in Table 1:

TABLE 1

| electrical propertystructure | Voltage(V) | brightness(cd/m) | current efficiency(cd/A) |
|---|---|---|---|
| OLED device without microstructures | 7.5 | 2910.8 | 29.21 |
| OLED device with microstructures | 7.1 | 3008.3 | 30.28 |
| change | −0.4 | +3.36% | +3.63% |

It can be seen from the comparison of the experimental data measured in Table 1 that, compared with the OLED device without the microstructures on the first electron injection layer, the OLED device with the first microstructures reduces the operating voltage of the OLED device, increases the light emission rate of the device, and accordingly increases the display brightness of the device, and improves the current efficiency in the OLED device.

The method for manufacturing the OLED device according to an embodiment of the present disclosure further includes: sequentially forming by evaporation a second organic light emitting layer and a cathode that are laminated on the charge generation layer. It includes sequentially forming a second hole injection layer, a second hole transport layer, a second light emitting layer, a second electron transport layer, a second electron injection layer, and a cathode that are laminated. Herein, a double-layer OLED display device is taken as an example, but a method for manufacturing a multilayer OLED display device is similar. The materials for forming the above functional layers may be same as those of the functional layers on a side of the charge generation layer adjacent to the base substrate, the thicknesses of the functional layers formed may be the same, or they may be adjusted to different values according to actual needs.

The manufacturing step of the cathode includes forming the cathode on the second electron injection layer by evaporation. In one example, a cathode having a thickness of 8 nm is formed from a Mg:Ag material, a surface of the cathode away from the base substrate is a light exit surface. The selection of such a material to manufacture nano-scale cathode facilitates the light emission and reduces the light loss rate.

In the embodiment of FIG. 7, the organic light emitting layers each include a hole injection layer, a hole transport layer, a light emitting layer, an electron transport layer, and an electron injection layer. The OLED device includes two organic light emitting layers, the first organic light emitting layer 300 includes a first hole injection layer 20, a first hole transport layer 30, a first light emitting layer 40, a first electron transport layer 50, and a first electron injection layer 60 that are sequentially laminated on the anode 200, and the second organic light emitting layer 400 includes a second hole injection layer 80, a second hole transport layer 90, a second light emitting layer 110, a second electron transport layer 120, and a second electron injection layer 130 that are sequentially laminated on the charge generation layer.

The schematic structural view of the OLED device provided by this embodiment is as shown in FIG. 7. The OLED device includes: a base substrate 100, and an anode 200, a first hole injection layer 20, a first hole transport layer 30, a first light emitting layer 40, a first electron transport layer 50, a first electron injection layer 60, a charge generation layer 70, a second hole injection layer 80, a second hole transport layer 90, a second light emitting layer 110, a second electron transport layer 120, a second electron injection layer 130, and a cathode 500 that are sequentially laminated on the base substrate. A surface of the charge generation layer 70 adjacent to the second hole injection layer 80 is provided with second microstructures 71, and the second microstructures 71 protrude toward a direction away from the base substrate 100.

The shape of the second microstructures 71 includes, but is not limited to, a hemisphere, a semi-ellipsoid, a hexahedron, a cylinder, a cone, a prism, a pyramid, a truncated cone or a truncated prism. The second microstructures formed include a plurality of microstructures of the same size distributed uniformly, for example, a bottom area of each of the second microstructures is 30*30 um$^2$, and an interval between two adjacent second microstructures is 20 um.

Correspondingly, in an embodiment of the present disclosure, there is further provided a method for manufacturing the OLED device according to any one of the above technical solutions, referring to the schematic flow chart as shown in FIG. 8, the method includes the following steps:

S71: sequentially forming an anode, a first hole injection layer, a first hole transport layer, a first light emitting layer, a first electron transport layer, a first electron injection layer, and a charge generation layer that are laminated on the base substrate;

Specifically, the base substrate includes a glass substrate or a flexible substrate. The step S71 includes: forming a first hole injection layer on the base substrate; forming a first hole transport layer on the first hole injection layer; forming a first light emitting layer on the first hole transport layer; forming a first electron transport layer on the first light emitting layer; forming a first electron injection layer on the first electron transport layer; and forming a charge generation layer on the first electron injection layer.

In the above forming process, each of the device functional layers is formed by an open mask. The forming process includes deposition methods such as evaporation, sputtering, or plasma deposition. In this embodiment, an evaporation process is used to form the functional layers.

In one example, the manufacturing materials and thicknesses of the above functional layers are the same as those of the previous embodiment, and therefore they will not be described herein again.

S72: forming protruded second microstructures on a surface of the charge generation layer away from the first electron injection layer.

The second microstructures are formed on the charge generation layer by an evaporation process using a fine metal mask (FME), the second microstructures are located on a surface of the charge generation layer away from the base substrate. In one example, microstructures having a thickness of 5 nm is formed by an evaporation process from 4,7-diphenyl-1,10-phenanthroline (chemical formula: Bphen) material, that is the same as the material of the charge generation layer.

The method for manufacturing the OLED device according to this embodiment further includes: sequentially forming by evaporation a second hole injection layer, a second hole transport layer, a second light emitting layer, a second electron transport layer, a second electron injection layer, and a cathode that are laminated on the charge generation layer. The second hole injection layer covers the microstructures provided on the charge generation layer. Similarly, the materials for forming the above functional layers and cathodes may be same as those of the functional layers on a side of the charge generation layer adjacent to the base substrate, the thicknesses of the functional layers formed may be the same, or they may be adjusted to different values according to actual needs.

This embodiment is different from the embodiment of FIG. 3 in that the positions and shapes of the first microstructures and the second microstructures in the two embodiments are different: the first microstructures in the embodiment of FIG. 3 are disposed on the surface of the charge generation layer adjacent to the base substrate, while the second microstructures in the embodiment of FIG. 7 are disposed on the surface of the charge generation layer away from the base substrate; the first microstructures are recessed microstructures, while the second microstructures are protruded microstructures. Although the positions and shapes of the microstructures are different, they are all located on one side of the light emitting layers, it can increase the contact area between the charge generation layer and its adjacent layers, increase the light emission rate, and improve the display brightness of the OLED device. The uneven structure of the first microstructures and the second microstructures increases the contact area between the charge generation layer and the adjacent functional layers, that is, increases the effective area of the charge generation layer to generate charge and inject charge, thereby improving the capability of the charge generation layer to generate and transfer charge and effectively reducing the operating voltage of the device.

Figure 9:
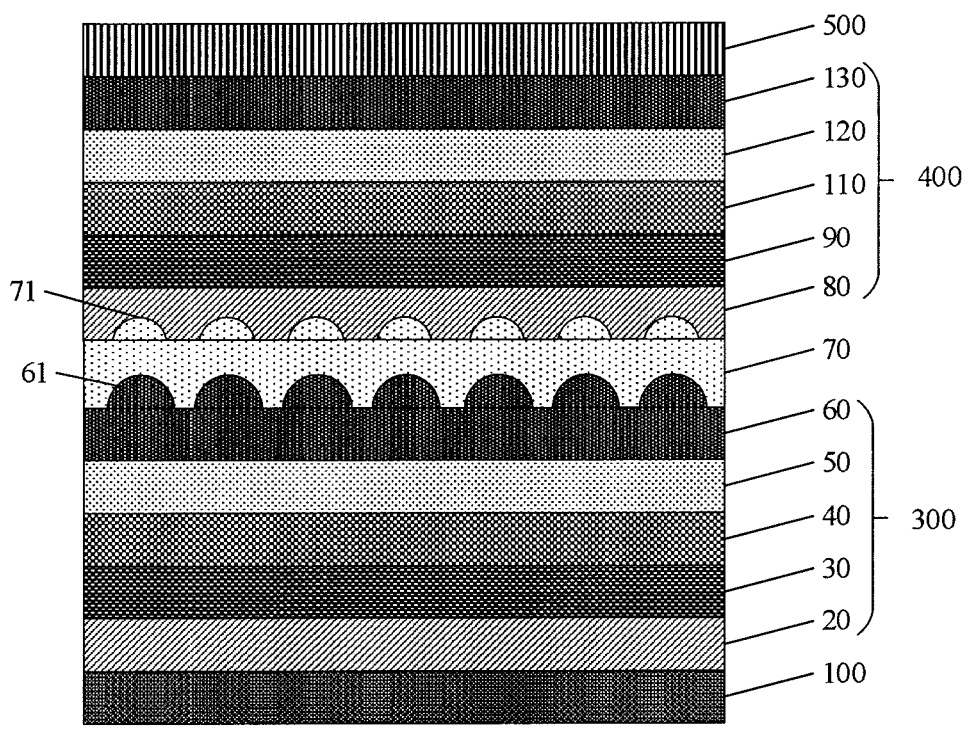
FIG. 9 is a schematic structural view of an OLED device according to an embodiment of the present disclosure.

In the embodiment of FIG. 9, the organic light emitting layers each include a hole injection layer, a hole transport layer, a light emitting layer, an electron transport layer, and an electron injection layer. The OLED device includes two organic light emitting layers. A first organic light emitting layer 300 thereof includes a first hole injection layer 20, a first hole transport layer 30, a first light emitting layer 40, a first electron transport layer 50, and a first electron injection layer 60 that are sequentially laminated on the anode 200. A second organic light emitting layer 400 thereof includes a second hole injection layer 80, a second hole transport layer 90, a second light emitting layer 110, a second electron transport layer 120, and a second electron injection layer 130 that are sequentially laminated on the charge generation layer.

An embodiment of the present disclosure provides an OLED device, and a schematic structural view thereof is shown in FIG. 9. The OLED device includes: a base substrate 100, and a first hole injection layer 20, a first hole transport layer 30, a first light emitting layer 40, a first electron transport layer 50, a first electron injection layer 60, a charge generation layer 70, a second hole injection layer 80, a second hole transport layer 90, a second light emitting layer 110, a second electron transport layer 120, a second electron injection layer 130, and a cathode 500 that are sequentially laminated on the base substrate 100. A surface of the charge generation layer 70 adjacent to the first electron injection layer 60 is provided with first microstructures 61, and a surface of the charge generation layer 70 adjacent to the second hole injection layer 80 is provided with second microstructures 71.

This embodiment is different from the embodiments of FIGS. 3 and 7 in that the OLED device provided by this embodiment is provided with two layers of microstructures, the microstructures are provided on both surfaces of the charge generation layer 70, and the microstructures include the first microstructures 61 provided in the embodiment of FIG. 3 and the second microstructures 71 provided in the embodiment of FIG. 7. The propagation path of the light is as follows: the light emitted from the first light emitting layer 40 is scattered by the first microstructures 61 on the surface of the charge generation layer 70 adjacent to the first electron injection layer 60, so that the original total reflection propagation path of light is broken, thereby increasing the light emission rate, and then the light is further scattered by the second microstructures 71 disposed on the surface of the charge generation layer 70 away from the first electron injection layer 60, so that the scattering range of light is expanded, thereby increasing the light emission rate and the uniformity of light emission. This embodiment further improves the light emission efficiency and the uniformity of light emission relative to the embodiment of FIG. 3 or the embodiment of FIG. 7, the provision of the first microstructures and/or the second microstructures changes the angle at which the original light is emitted from the charge generation layer, so that the wavelength of the emergent light is changed, thereby improving the color rendering of the OLED device. Similarly, the uneven structure of the first microstructures and the second microstructures causes the contact area between the charge generation layer 70 and its adjacent functional layers to increase, thereby causing the effective area of the charge generation layer 70 for generating charge and injecting charge to increase. The technical effect brought about by this embodiment further improves the capability of the charge generation layer to generate and transfer charge and effectively reduces the operating voltage of the device, based on the technical effect brought about by the embodiment of FIG. 3 or the embodiment of FIG. 7.

The method for manufacturing the OLED device according to this embodiment includes: sequentially forming by evaporation an anode, a first hole injection layer, a first hole transport layer, a first light emitting layer, a first electron transport layer, and a first electron injection layer that are laminated on the base substrate; forming by evaporation protruded microstructures on a surface of the first electron injection layer away from the base substrate; forming by evaporation a charge generation layer on the first electron injection layer, the charge generation layer covering the protruded microstructures; forming by evaporation protruded microstructures on a surface of the charge generation layer away from the base substrate; forming by evaporation a second hole injection layer on the charge generation layer, the second hole injection layer covering the protruded microstructures; sequentially forming by evaporation a second hole transport layer, a second light emitting layer, a second electron transport layer, a second electron injection layer, and a cathode that are laminated on the second hole injection layer.

The surface of the second hole injection layer adjacent to the charge generation layer is accordingly formed with recessed microstructures, and the surface of the second hole injection layer away from the charge generation layer is configured to be a flat surface to reduce process complexity, as shown in FIG. 9.

In one example, the materials and thicknesses of the functional layers are the same as those of the previous embodiments, and therefore they will not be described herein again.

Further, an embodiment of the present disclosure further provides a display apparatus, including the OLED device according to any one of the above technical solutions.

The display apparatus may be any product or component having a display function such as an electronic paper, a display panel, an OLED panel, a mobile phone, a tablet computer, a television, a display, a notebook computer, a digital photo frame, a navigator, and the like.

The solutions of the embodiments of the present disclosure have the following advantages:

In the OLED device provided by the embodiments of the present disclosure, by means of providing microstructures on at least one of two surfaces of the charge generation layer adjacent to the two adjacent organic light emitting layers, the contact area between the charge generation layer and the adjacent organic light emitting layer is increased, i.e., the effective area of the charge generation layer for generating charge and injection charge is increased, thereby improving the capability of the charge generation layer to generate and transfer charge, and effectively reducing the operating voltage of the device.

In the OLED device provided by the embodiments of the present disclosure, at least one of two surfaces of the charge generation layer adjacent to the two adjacent organic light emitting layers is provided with microstructures, the light emitted from the light emitting layer is scattered by the microstructures on the surfaces of the charge generation layer adjacent to and/or away from the the electron injection layer, so that the original total reflection propagation path of light is broken, thereby increasing the light emission rate and the uniformity of light emission. The provision of the microstructures changes the original incident angle of the light on the light exit surface, so that the wavelength of the emergent light is changed, thereby improving the color rendering of the OLED device.

Since the display apparatus is based on the OLED device, the display apparatus necessarily inherits all the advantages of the OLED device.

The above description only refers to a part of the embodiments of the present disclosure. It should be noted that many improvements and refinements may be made by those skilled in the art without departing from the principle of the embodiments of the present disclosure, and such improvements and refinements also fall within the scope of the present disclosure.

What is claimed is:

1. An OLED device, comprising:
   an anode;
   a cathode;
   at least two organic light emitting layers between the anode and the cathode;
   a charge generation layer between two adjacent organic light emitting layers in the at least two organic light emitting layers,
   wherein at least one of two surfaces of the charge generation layer adjacent to the two adjacent organic light emitting layers is provided with microstructures, and
   wherein the microstructures comprise recessed structures extending away from the anode, and the microstructures have a profile in a shape of semicircle or arc in a cross section perpendicular to the organic light emitting layers.

2. The OLED device according to claim 1, wherein the microstructures comprise protruding structures extending away from the anode, and the microstructures have a profile in a shape of semicircle or arc in a cross section perpendicular to the organic light emitting layers.

3. The OLED device according to claim 2, wherein the microstructures are in a shape of a hemisphere, a semi-ellipsoid, a hexahedron, a cylinder, a cone, a prism, a pyramid, a truncated cone or a truncated prism.

4. The OLED device according to claim 1, wherein the microstructures are plural and the plurality of microstructures are arranged in an array.

5. The OLED device according to claim 1, wherein the at least two organic light emitting layers comprise a first organic light emitting layer and a second organic light emitting layer, the first organic light emitting layer being disposed between the anode and the charge generation layer, and the second organic light emitting layer being disposed between the charge generation layer and the cathode, and
   wherein the first organic light emitting layer comprises: a first hole injection layer, a first hole transport layer, a first light emitting layer, a first electron transport layer, and a first electron injection layer which are sequentially laminated on the anode, and the second organic light emitting layer comprises a second hole injection layer, a second hole transport layer, a second light emitting layer, a second electron transport layer, and a second electron injection layer which are sequentially laminated on the charge generation layer.

6. The OLED device according to claim 1, wherein the OLED device is a top emission type light emitting device.

7. The OLED device according to claim 1, further comprising a base substrate disposed on a surface of the anode away from the charge generation layer.

8. The OLED device according to claim 7, wherein the base substrate is a glass substrate or a flexible substrate.

9. A method for manufacturing the OLED device according to claim 1, comprising:
forming a structure in which one of the at least two organic light emitting layers, the charge generation layer, and another of the at least two organic light emitting layers are sequentially laminated,
wherein the forming a structure in which one of the at least two organic light emitting layers, the charge generation layer, and another of the at least two organic light emitting layers are sequentially laminated comprises forming the microstructures on the at least one of two surfaces of the charge generation layer adjacent to the two adjacent organic light emitting layers, and
wherein the forming the microstructure on the at least one of two surfaces of the charge generation layer adjacent to the two adjacent organic light emitting layers comprises:
forming the microstructure on a surface of the charge generation layer adjacent to the anode, the microstructures being recessed toward a direction away from the anode.

10. The method according to claim 9, wherein the forming the microstructures on the at least one of two surfaces of the charge generation layer adjacent to the two adjacent organic light emitting layers comprises:
forming the microstructures on a surface of the charge generation layer away from the anode, the microstructures protruding toward a direction away from the anode.

11. The method according to claim 9, further comprising: forming the anode; and forming the cathode,
wherein the forming a structure in which one of the at least two organic light emitting layers, the charge generation layer, and another of the at least two organic light emitting layers are sequentially laminated comprises:
sequentially forming a first hole injection layer, a first hole transport layer, a first light emitting layer, a first electron transport layer, and a first electron injection layer that are laminated on the anode;
forming the charge generation layer on the first electron injection layer;
sequentially forming a second hole injection layer, a second hole transport layer, a second light emitting layer, a second electron transport layer, and a second electron injection layer that are laminated on the charge generation layer.

12. The method according to claim 11, wherein, before the forming the anode, the method further comprises forming a base substrate,
wherein the anode is disposed on the base substrate.

13. The method according to claim 12, wherein the base substrate is a glass substrate or a flexible substrate.

14. The method according to claim 9, wherein, before the forming the microstructures on a surface of the charge generation layer adjacent to the anode, the method comprises: forming protruded microstructures on a surface of the organic light emitting layer between the anode and the charge generation layer away from the anode.

15. The method according to claim 9, wherein the microstructures are formed by using an evaporation, sputtering or plasma deposition process.

16. A display apparatus, comprising the OLED device according to claim 1.

17. The OLED device according to claim 1, wherein the microstructures are uniformly distributed.

18. The OLED device according to claim 1, wherein a surface of the charge generation layer is provided with protrusions and a surface of one of the organic light emitting layers adjacent to the charge generation layer is provided with recesses; or
a surface of the charge generation layer is provided with recesses and a surface of one of the organic light emitting layers adjacent to the charge generation layer is provided with protrusions.

* * * * *